(12) United States Patent
Hellriegel et al.

(10) Patent No.: US 7,330,350 B2
(45) Date of Patent: Feb. 12, 2008

(54) SYSTEMS AND METHODS FOR COOLING COMPUTER MODULES IN COMPUTER CABINETS

(75) Inventors: Stephen V. R. Hellriegel, Seattle, WA (US); Alexander I. Yatskov, Seattle, WA (US); Douglas P. Kelley, Seattle, WA (US)

(73) Assignee: Cray Inc., Seattle, WA (US)

( * ) Notice: Subject to any disclaimer, the term of this patent is extended or adjusted under 35 U.S.C. 154(b) by 164 days.

(21) Appl. No.: 10/862,031

(22) Filed: Jun. 4, 2004

(65) Prior Publication Data

US 2005/0270738 A1    Dec. 8, 2005

(51) Int. Cl.
*G06F 1/20* (2006.01)

(52) U.S. Cl. .................. 361/687; 361/695; 165/122

(58) Field of Classification Search ............... 361/687, 361/695; 165/122
See application file for complete search history.

(56) References Cited

U.S. PATENT DOCUMENTS

| | | | |
|---|---|---|---|
| 4,874,127 A | | 10/1989 | Collier |
| 5,035,628 A | | 7/1991 | Casciotti et al. |
| 5,150,277 A | | 9/1992 | Bainbridge et al. |
| 5,161,087 A | | 11/1992 | Frankeny et al. |
| 5,273,438 A | | 12/1993 | Bradley |
| 5,323,847 A | * | 6/1994 | Koizumi et al. ...... 165/104.33 |
| 5,339,214 A | | 8/1994 | Nelson |
| 5,345,779 A | | 9/1994 | Feeney |
| 5,376,008 A | | 12/1994 | Rodriguez |
| 5,395,251 A | | 3/1995 | Rodriguez et al. |
| 5,402,313 A | | 3/1995 | Casperson et al. |
| 5,410,448 A | * | 4/1995 | Barker et al. ............ 361/695 |
| 5,572,403 A | * | 11/1996 | Mills ........................ 361/695 |
| 5,718,628 A | | 2/1998 | Nakazato et al. |
| 6,046,908 A | | 4/2000 | Feng |
| 6,115,242 A | | 9/2000 | Lambrecht |

(Continued)

FOREIGN PATENT DOCUMENTS

JP    2004-79754    8/2002

(Continued)

OTHER PUBLICATIONS

JAMSTEC/Earth Simulator Center, "Processor Node (PN) Cabinet," one page http://www.es.jamstec.go.jp/esc/eng/Hardware/pnc.html [accessed Mar. 5, 2004].

(Continued)

*Primary Examiner*—Jayprakash Gandhi
*Assistant Examiner*—Ingrid Wright
(74) *Attorney, Agent, or Firm*—Perkins Coie LLP

(57) ABSTRACT

Systems and methods for cooling computer components in large computer systems are disclosed herein. In one embodiment, a computer system configured in accordance with aspects of the invention can include a computer module positioned in a chassis, and an air mover configured to move air through the chassis and past the computer module. The computer system can further include a pressure sensor operably coupled to the air mover. If the pressure sensor determines that the difference between a first air pressure inside the chassis and a second air pressure outside the chassis is less than a preselected pressure, the air mover can increase the flow of air through the chassis and past the computer module.

61 Claims, 7 Drawing Sheets

U.S. PATENT DOCUMENTS

| | | | |
|---|---|---|---|
| 6,158,502 | A | 12/2000 | Thomas |
| 6,167,948 | B1 | 1/2001 | Thomas |
| 6,310,773 | B1 | 10/2001 | Yusuf et al. |
| 6,416,330 | B1 | 7/2002 | Yatskov |
| 6,435,266 | B1 | 8/2002 | Wu |
| 6,515,862 | B1 | 2/2003 | Wong et al. |
| 6,519,955 | B2 | 2/2003 | Marsala |
| 6,550,530 | B1 | 4/2003 | Bilski |
| 6,557,357 | B2 | 5/2003 | Spinazzola et al. |
| 6,564,858 | B1 | 5/2003 | Stahl |
| 6,644,384 | B2 | 11/2003 | Stahl |
| 6,679,081 | B2 | 1/2004 | Marsala |
| 6,776,707 | B2 | 8/2004 | Koplin |
| 6,904,968 | B2 * | 6/2005 | Beitelmal et al. ........... 165/247 |
| 6,975,510 | B1 * | 12/2005 | Robbins et al. ............. 361/695 |
| 6,992,889 | B1 | 1/2006 | Kashiwagi et al. |
| 6,999,316 | B2 | 2/2006 | Hamman |
| 7,051,946 | B2 | 5/2006 | Bash et al. |
| 2001/0052412 | A1 | 12/2001 | Tikka |
| 2002/0181200 | A1 | 12/2002 | Chang |
| 2003/0056941 | A1 | 3/2003 | Lai et al. |
| 2004/0008491 | A1 | 1/2004 | Chen |
| 2004/0052052 | A1 | 3/2004 | Rivera |
| 2005/0120737 | A1 | 6/2005 | Borror et al. |
| 2005/0168945 | A1 * | 8/2005 | Coglitore ................... 361/695 |
| 2005/0225936 | A1 | 10/2005 | Day |
| 2005/0241810 | A1 * | 11/2005 | Malone et al. .............. 165/122 |

FOREIGN PATENT DOCUMENTS

| | | |
|---|---|---|
| WO | WO-01-86217 | 11/2001 |
| WO | WO-05/027609 | 3/2005 |

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

Hannemann, Robert et al., "Pumped Liquid Multiphase Cooling," ASME, 2004, IMECE 2004, Paper IMECE2004-60669, Anaheim, CA, 5 pages.

Pitasi, M. "Thermal Management System Using Pumped Liquid R-134a with two Phase Heat Transfer," Thermal Form & Function LLC, Manchester, MA, http://www.coolingzone.com/Guest/News/NL_MAR_2002/TFF/Tff.html, pp. 1-9, Mar. 2002.

Vogel, Marlin et al., "Low Profile Heat Sink Cooling Technologies for Next Generation CPU Thermal Designs," *Electronic Cooling Online*, Feb. 17, 2005, 11 pages.

Webb, Warren, "Take the heat: Cool that hot embedded design," *EDN*, May 13, 2004, 5 pages.

* cited by examiner

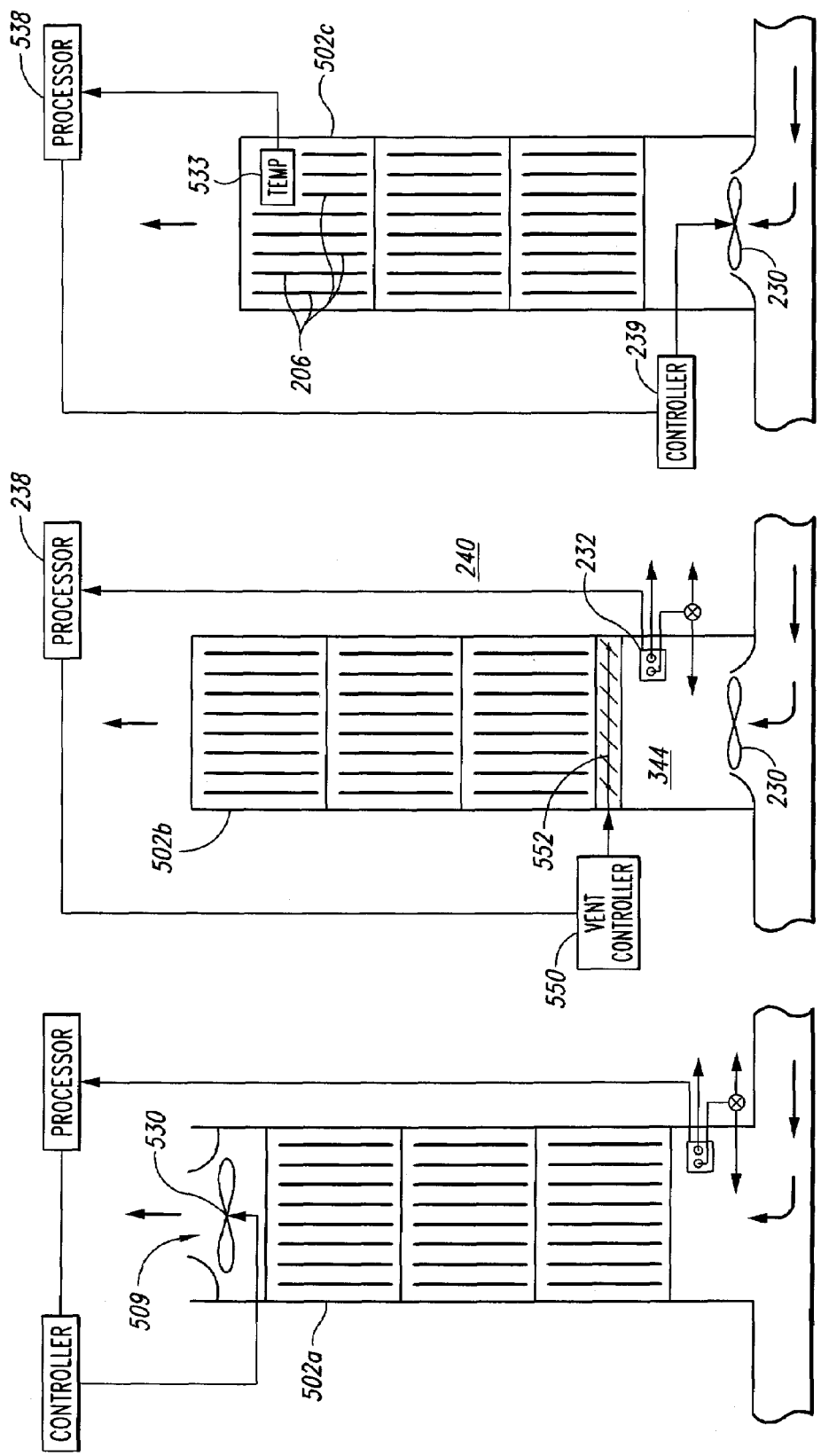

United States Patent 7,330,350 B2

SYSTEMS AND METHODS FOR COOLING COMPUTER MODULES IN COMPUTER CABINETS

CROSS-REFERENCE TO APPLICATION INCORPORATED BY REFERENCE

The subject matter of U.S. patent application Ser. No. 10/805,875, titled "SYSTEMS AND METHODS FOR INTER-COOLING COMPUTER CABINETS," and filed Mar. 22, 2004, is incorporated herein in its entirety by reference.

TECHNICAL FIELD

The following disclosure relates generally to systems and methods for cooling computer components and, more particularly, to systems and methods for cooling high density computer components housed in cabinets in large computer systems.

BACKGROUND

Supercomputers and other large computer systems typically include a large number of processors housed in cabinets arranged in banks. FIG. 1, for example, illustrates a large computer system 100 configured in accordance with the prior art. The computer system 100 includes a plurality of computer cabinets 102 (identified individually as computer cabinets 102a-d) situated on a floor 103. Each of the computer cabinets 102 contains a plurality of computer modules 106 arranged vertically in close proximity to each other. Each of the computer modules 106 can include a motherboard carrying one or more processors, buses, and associated memory. The computer modules 106 are positioned close together for a number of reasons. One reason is that close proximity can increase computational performance by increasing signal speed and reducing signal decay. Another reason is that close proximity can reduce cable cost and routing complexity. One downside of arranging the computer modules 106 in close proximity, however, is that they can generate considerable heat during operation that can result in damage or reduced performance if not dissipated.

To dissipate the heat generated by the computer modules 106, the computer system 100 further includes an air conditioning unit 110. The air conditioning unit 110 includes a cooling coil 112 and two air movers 114. In operation, the air conditioning unit 110 draws in warm air from around the computer cabinets 102 and cools the air before flowing it into a plenum 104 extending beneath the floor 103. The plenum 104 distributes the high pressure cooling air to the computer cabinets 102. Fans 130 positioned toward the top of the computer cabinets 102 draw the cooling air upward through the computer cabinets 102 to cool the computer modules 106. Warm air from the computer cabinets 102 then circulates back to the air conditioning unit 110 as part of a continual cooling cycle.

One shortcoming associated with the computer system 100 described above is that the computer cabinets 102 receive a non-uniform distribution of cooling air from the air conditioning unit 110. The non-uniform distribution of cooling air can result from the placement of the computer cabinets 102 relative to the air conditioning unit 110 and other reasons. As a result of this imbalance, the computer modules 106 in the computer cabinet 102a may not be sufficiently cooled, while the computer modules 106 in the computer cabinet 102d may be receiving more cooling air than is necessary for sufficient cooling.

One way to overcome this problem is to increase the flow rate of cooling air from the air conditioning unit 110. This approach is often impractical, however, because of the high cost of constructing and operating such high-capacity air conditioning systems. Further, this approach often requires larger fans, increased coolant flows, and higher power requirements than the computer facility was originally designed to accommodate. In addition, such systems are typically very noisy, creating a difficult work environment for facility personnel.

Another way to improve the cooling characteristics of the air conditioning system described above is to construct ducts (not shown) between the floor plenum 104 and individual computer cabinets 102 in an effort to balance the air flow between cabinets. While theoretically possible, in practice this approach is extremely difficult for large computer systems because of the many variables involved. For example, the addition or removal of a single computer cabinet 102 could disturb the balance of the entire system, requiring readjustment of the ducting to rebalance the air distribution.

A further approach to improve the cooling characteristics of the air conditioning system described above is to reduce the temperature of the cooling air provided by the air conditioning unit 110 in an attempt to compensate for the non-uniform air distribution. This approach is often impractical as well, however, because it typically requires lowering the air temperature below the dew point in the air conditioning unit 110, causing water vapor to condense out of the air. The removal of water vapor can lower the relative humidity to such a point that electrostatic discharge becomes a concern in the facility. As a result, water vapor may have to be added back into the facility air to bring the relative humidity back up to an acceptable level.

BRIEF DESCRIPTION OF THE DRAWINGS

FIGS. 5A-5C are partially schematic elevation views of computer cabinets and associated air flow balancing systems configured in accordance with other embodiments of the invention.

DETAILED DESCRIPTION

The following disclosure describes several embodiments of systems and methods for cooling computer modules in large computer systems. A computer system configured in accordance with one aspect of the invention includes a chassis, a computer module positioned in the chassis, and an air mover configured to move air through the chassis and past the computer module. The computer system can further include a sensor configured to measure a parameter associated with the air moving through the chassis. The air mover can be operably coupled to the sensor and configured to respond to a change in the parameter.

In one embodiment, the parameter is a pressure differential between a first air pressure inside the chassis and a second air pressure outside the chassis. In this embodiment, the air mover is configured to increase the flow of air through the chassis if the pressure differential is less than a preselected pressure. In another embodiment, the parameter is a temperature inside the chassis. In this embodiment, the air mover is configured to increase the flow of air through the chassis if the temperature exceeds a preselected temperature.

A method for cooling a computer module positioned in a chassis in accordance with another aspect of the invention includes sensing a difference between a first air pressure inside the chassis and a second air pressure outside the chassis. The method can further include changing a flow of air past the computer module in the chassis based on the difference between the first and second air pressures. In one embodiment, changing a flow of air includes controlling an air mover in flow communication with the chassis. In another embodiment, changing a flow of air includes increasing the flow of air through the chassis when the difference between the first and second air pressures is less than or equal to a preselected pressure.

Specific details of several embodiments of the invention are described below to provide a thorough understanding of such embodiments. However, other details describing well-known structures often associated with large computer systems and air conditioning systems for large computer systems are not set forth below to avoid unnecessarily obscuring the description of the various embodiments. Further, those of ordinary skill in the art will understand that the invention may have other embodiments that include additional elements or lack one or more of the elements described below with reference to FIGS. 2-6.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

Figure 1:
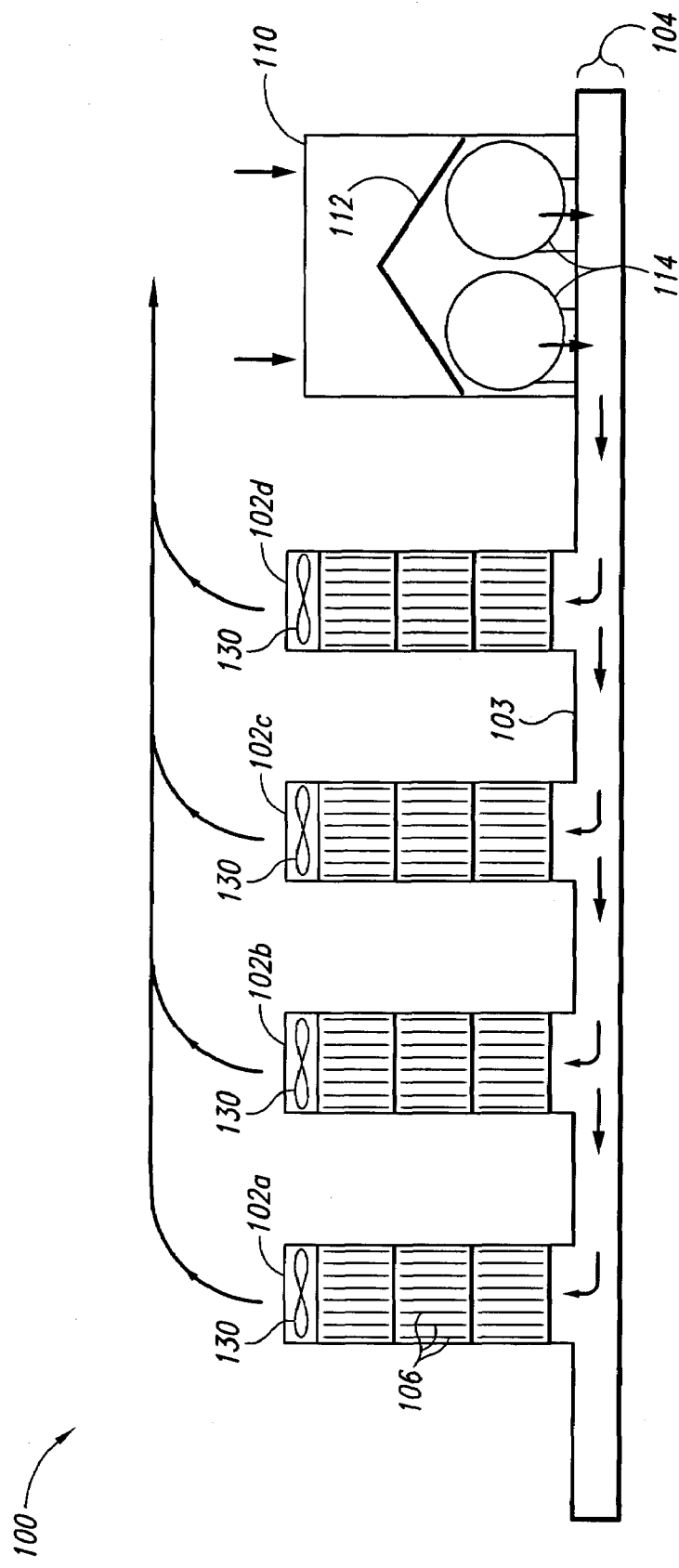
FIG. 1 illustrates a large computer system configured in accordance with the prior art.
Figure 2:
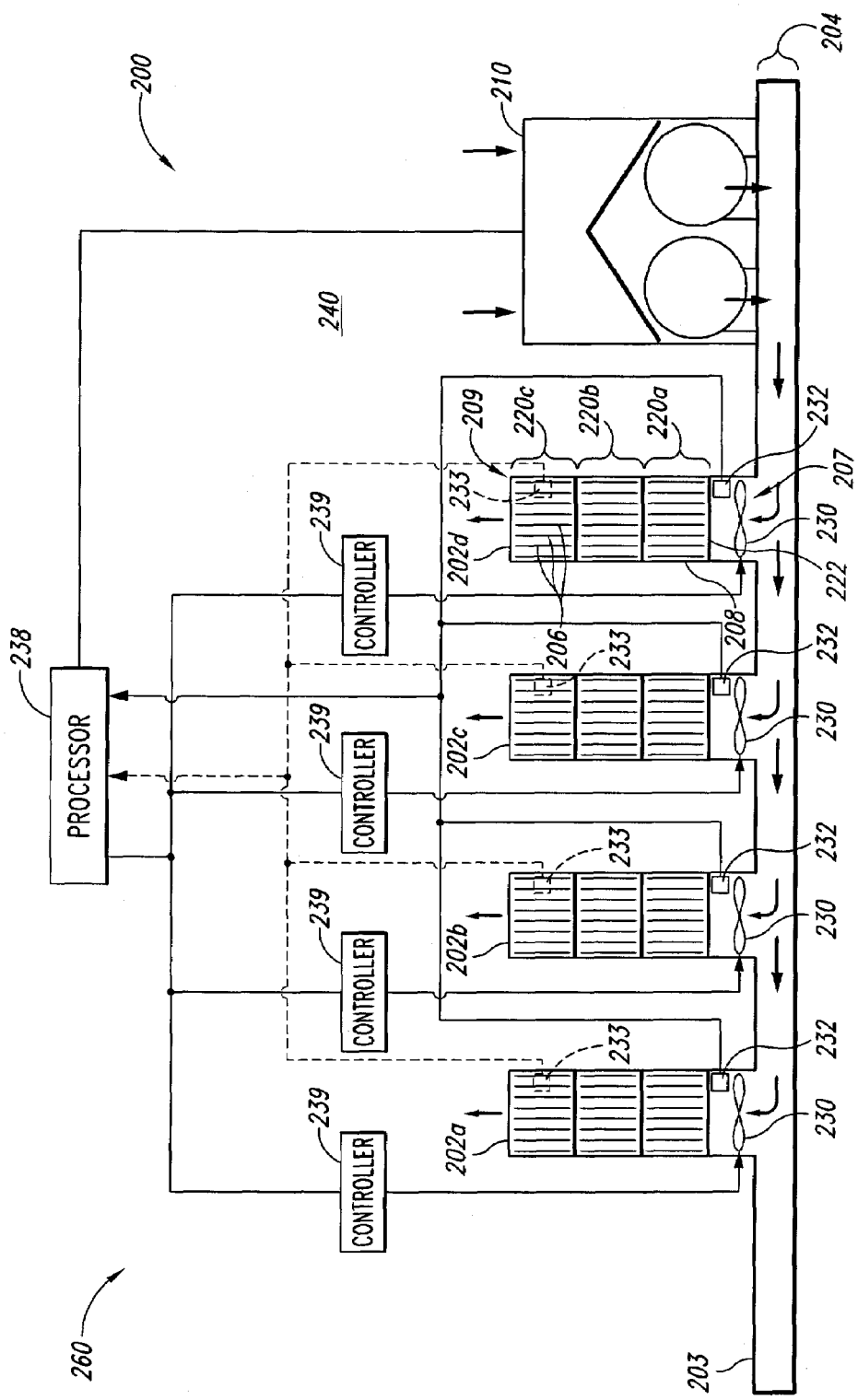
FIG. 2 is a partially schematic elevation view of a computer system having an air flow balancing system configured in accordance with an embodiment of the invention.

FIG. 2 is a partially schematic elevation view of a computer system 200 configured in accordance with an embodiment of the invention. In one aspect of this embodiment, the computer system 200 includes a plurality of computer cabinets 202 (identified individually as a first computer cabinet 202a, a second computer cabinet 202b, a third computer cabinet 202c, and a fourth computer cabinet 202d) situated on a floor 203 in a room 240. Each of the computer cabinets 202 can include a plurality of computer module compartments 220 (identified individually as computer module compartments 220a-220c) arranged vertically in a chassis 208. Each of the computer module compartments 220 can hold a plurality of computer modules 206 oriented edgewise with respect to the flow of cooling air through the chassis 208.

In another aspect of this embodiment, each of the computer cabinets 202 can further include an air inlet portion 207 configured to receive high pressure cooling air from an air conditioning unit 210 via a floor plenum 204. The cooling air flows upwardly through the chassis 208 and past the computer modules 206, exiting from an air outlet portion 209. Each of the computer cabinets 202 can additionally include an air mover 230 (e.g., a fan) positioned at least proximate to the air inlet portion 207 to facilitate movement of the cooling air through the chassis 208. A diffuser 222 can be positioned above the air mover 230 to normalize the velocity and pressure distribution of the cooling air before it flows into the computer module compartments 220.

In a further aspect of this embodiment, the computer system 200 additionally includes an air flow balancing system 260 ("balancing system 260") configured to balance the distribution of cooling air from the air conditioning unit 210 to the computer cabinets 202. The balancing system 260 can include a plurality of pressure sensors 232 and a plurality of controllers 239 operably coupled to a processor 238. Each of the controllers 239 is operably connected to a corresponding air mover 230. Each of the pressure sensors 232 is operatively associated with a corresponding computer cabinet 202. Although the pressure sensors 232 are positioned above the air movers 230 and below the diffusers 222 in the illustrated embodiment, in other embodiments, the pressure sensors 232 can be positioned above the diffusers 222.

In operation, the pressure sensors 232 measure the difference in static pressure between the air inside the corresponding computer cabinet 202 and the air in the room 240. The processor 238 receives this information from the pressure sensors 232. Based on this information, the processor 238 determines if the speed (i.e., the output) of one or more of the air movers 230 needs to be adjusted to maintain a uniform distribution of cooling air between all of the computer cabinets 202 in the computer system 200. If the processor 238 determines that one or more of the air movers 230 needs to be adjusted, the processor 238 transmits appropriate commands to the corresponding controllers 239. In one embodiment, the controllers 239 can include variable frequency drives that can modulate the speed of the associated air movers 230 as necessary to comply with the commands from the processor 238.

In one embodiment, the pressure sensors 232 can include gage pressure sensors configured to measure the difference in static pressure between the air inside the corresponding computer cabinet 202 and the air in the room 240 (i.e., the ambient pressure). In this embodiment, the static air pressure in the room 240 will, as a rule, be less than the static air pressure in the computer cabinet 202 during operation of the air conditioning unit 210. One advantage of using gage pressure sensors in this capacity is that they can provide greater sensitivity for measuring the relatively low pressure differentials that may be experienced by the air flow balancing system 260. Throughout the present disclosure, the terms "pressure sensor," "pressure differential sensor," and the like refer to gage pressure sensors as well as other types of pressure sensors suitable for measuring the various pressure differentials described herein.

In other embodiments, the balancing system 260 can include other sensors for measuring other air flow parameters in addition to, or in place of, static air pressure. For example, in another embodiment, the balancing system 260 can include a plurality of temperature sensors 233 operably coupled to the processor 238. Each of the temperature sensors 233 can be configured to measure a temperature inside a corresponding computer cabinet 202, such as a temperature of one or more of the computer modules 206 at a "hot spot" in the computer cabinet 202. This temperature information can be used by the processor 238 in a number of different ways to control the air flow through the computer cabinet 202. For example, in one embodiment, the pressure sensor 232 can be omitted and the processor 238 can control the air flow through the computer cabinet 202 based solely on information received from the temperature sensor 233. For example, if the temperature information indicates that one or more of the computer modules 206 may be overheating, the processor 238 can cause the corresponding air mover 230 to increase the flow of cooling air through the computer cabinet 202.

In other embodiments, the processor 238 can control the air flow through the chassis 208 by using information from both the pressure sensor 232 and the temperature sensor 233. For example, in one embodiment, the processor 238 can control the air mover 230 based on information from the pressure sensor 232, unless or until information from the temperature sensor 233 indicates that a temperature inside the computer cabinet 202 may be approaching an upper limit. If so, the processor 238 ignores the pressure sensor 232 and commands the corresponding controller 239 to increase the output from the air mover 230.

One advantage of the balancing system 260 described above is that it can dynamically adjust the flow of cooling air through each of the individual computer cabinets 202 as needed to maintain a relatively uniform distribution of cooling air from the air conditioning unit 210. For example, if the pressure sensor 232 associated with the first computer cabinet 202a indicates that the first computer cabinet 202a is receiving an insufficient amount of cooling air, then the balancing system 260 can increase the speed of the corresponding air mover 230 to increase the air flow through the first computer cabinet 202a. Conversely, if the fourth computer cabinet 202d is receiving a surplus of cooling air from the air conditioning unit 210, then the balancing system 260 can decrease the speed of the corresponding air mover 230 to reduce the flow of cooling air through the fourth computer cabinet 202d. One advantage of balancing air flows in the foregoing manner is that it saves energy because it allows some of the air movers 230 to operate at a slower speed if doing so provides adequate cooling. In addition, reducing the speed of at least some of the air movers 230 can reduce the noise in the room 240, improving the work environment for facility personnel (not shown). A further advantage of the balancing system 260 is that it can compensate for facility and/or air conditioning system shortcomings that would otherwise impede a uniform distribution of cooling air.

In another aspect of the embodiment illustrated in FIG. 2, the processor 238 can be operably coupled to the air conditioning unit 210. One advantage of this configuration is that it enables the processor 238 to increase the output from the air conditioning unit 210 if necessary to maintain an adequate flow of cooling air through one or more of the computer cabinets 202. One situation in which this may be necessary occurs when the processor 238 determines that one of the computer cabinets 202 lacks a sufficient flow of cooling air, and the corresponding air mover 230 is unable to sufficiently increase the air flow. The air mover 230 may be unable to sufficiently increase the air flow because 1) the air mover 230 may already be operating at maximum output, or 2) the air mover 230 may be operating in a low pressure zone of the floor plenum 204, in which case increasing the speed of the air mover 230 may not appreciably increase airflow through the corresponding computer cabinet 202. If the air mover 230 is unable to increase air flow for either of these reasons, the processor 238 can command the air conditioning unit 210 to increase output, thereby increasing the air pressure in the floor plenum 204 and consequently increasing the air flow through the computer cabinets 202.

A further advantage of operatively coupling the processor 238 to the air conditioning unit 210 is that the output from the air conditioning unit 210 can be coordinated with the computer cabinets 202. For example, if all the computer cabinets 202 have a surplus airflow, then the processor 238 can reduce output from the air conditioning unit 210 to save energy. Further, if a particular air mover 230 is positioned over a low pressure zone of the floor plenum 204 such that increasing the speed of the air mover 230 will not appreciably increase air flow, then the processor 238 can increase output from the air conditioning unit 210 rather than waste energy by increasing the speed of the air mover 230 to no avail.

Figure 3:
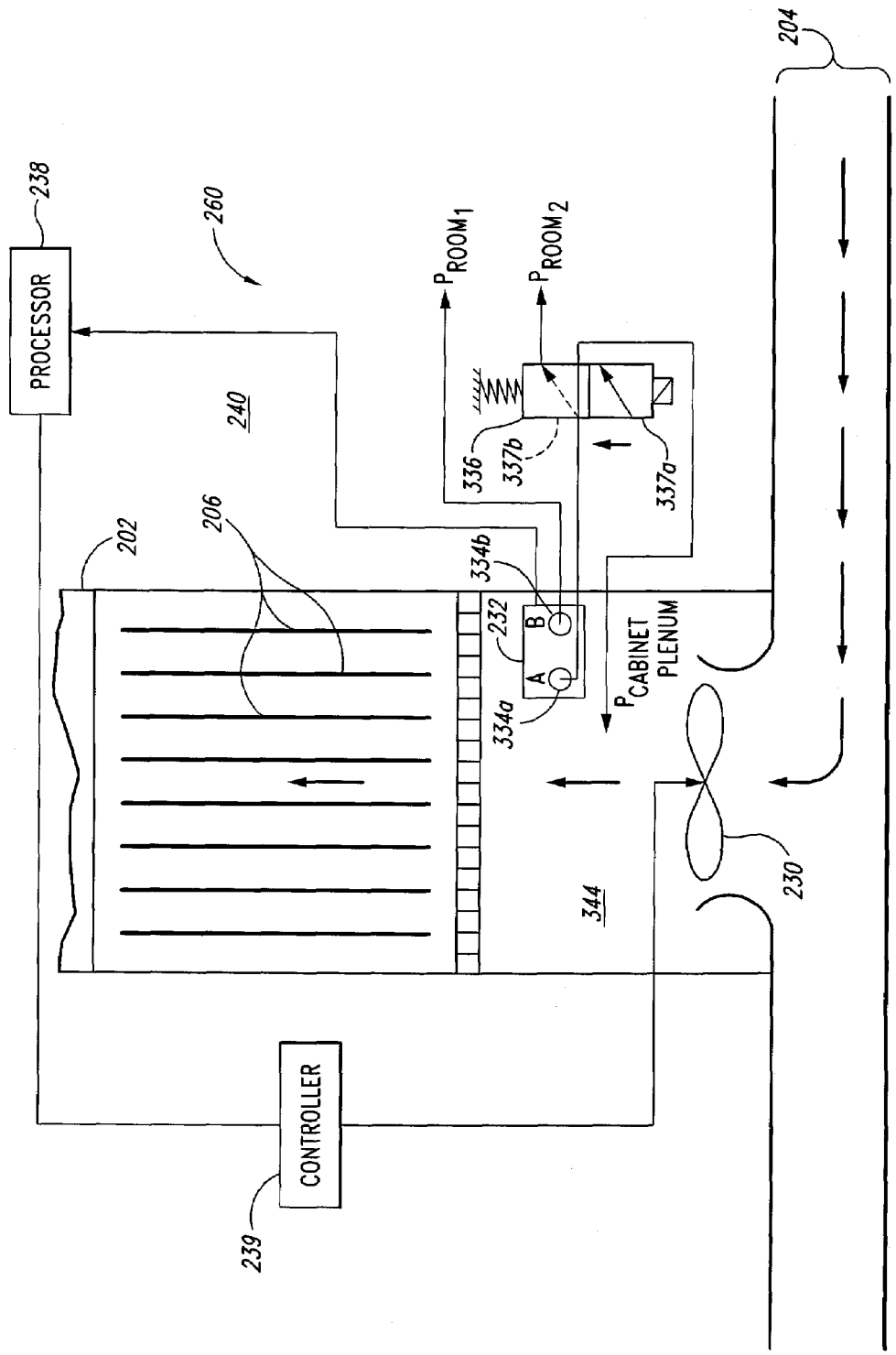
FIG. 3 is an enlarged, partially schematic elevation view of a portion of the computer system of FIG. 2 illustrating aspects of the air flow balancing system configured in accordance with an embodiment of the invention.

FIG. 3 is an enlarged, partially schematic elevation view of a portion of the computer system 200 of FIG. 2 illustrating aspects of the balancing system 260 configured in accordance with an embodiment of the invention. In one aspect of this embodiment, the pressure sensor 232 can include a first pressure port 334a and a second pressure port 334b. The second pressure port 334b can be configured to sense the static air pressure in the room 240. The first pressure port 334a can be operably coupled to a valve 336. When the valve 336 is in a first position 337a as illustrated in FIG. 3, the valve 336 enables the first pressure port 334a to sense the static air pressure in a cabinet plenum 344. When the valve 336 is in a second position 337b (shown in phantom line), the valve 336 enables the first pressure port 334a to sense the static air pressure in the room 240. In one embodiment, the valve 336 can be a solenoid valve that moves from the first position 337a to the second position 337b when energized, and returns from the second position 337b to the first position 337a when not energized. In other embodiments, the valve 336 can be other types of valves that allow the first pressure port 334a to optionally sense the pressure in either the cabinet plenum 344 or the room 240.

Figure 4A:
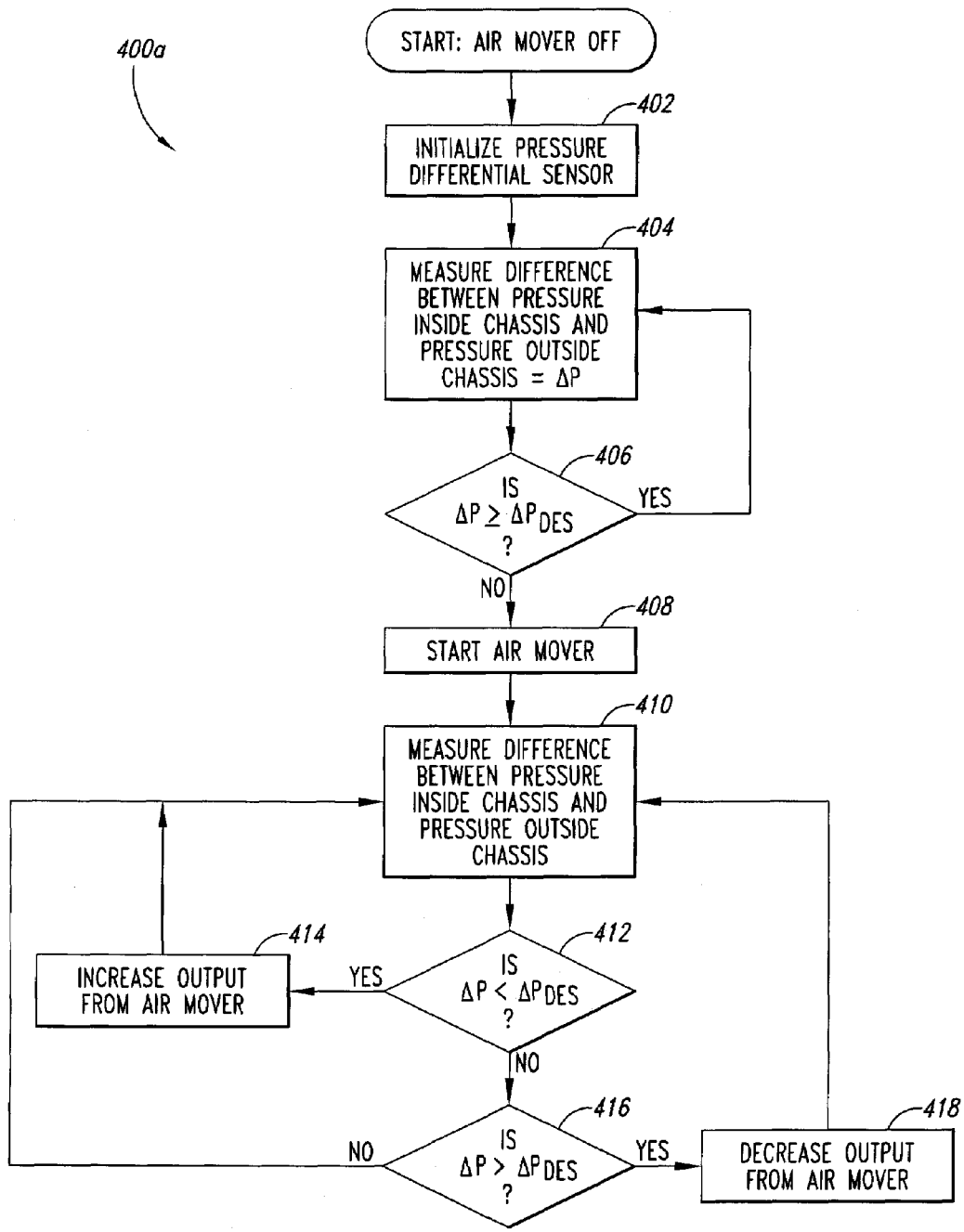
FIGS. 4A and 4B are flow diagrams illustrating methods for adjusting the flow of cooling air through computer cabinets in accordance with embodiments of the invention.
Figure 4B:
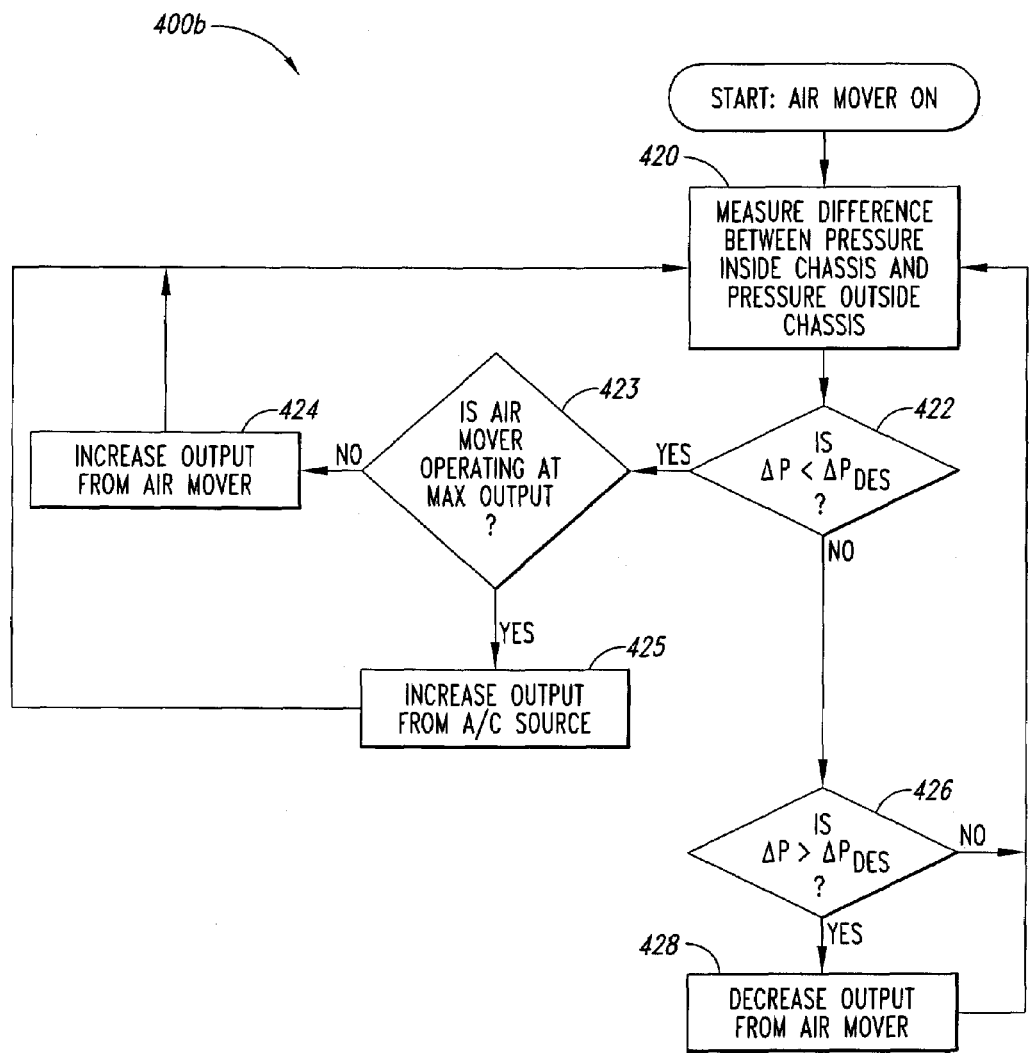

FIGS. 4A and 4B are flow diagrams illustrating methods 400a and 400b, respectively, for operating the balancing system 260 of FIGS. 2 and 3 in accordance with embodiments of the invention. In one embodiment, the methods of FIGS. 4A and 4B can be implemented by the processor 238 (FIGS. 2 and 3) according to computer-readable instructions stored on a suitable computer-readable medium. Referring to FIGS. 2-4A together, in one aspect of this embodiment, the method 400a starts when the air conditioning unit 210 is flowing air to the computer cabinet 202 via the floor plenum 204, and the air mover 230 is "off" (i.e., the air mover 230 is not moving the air through the computer cabinet 202). In block 402, the method 400a "initializes" the pressure sensor 232. This step may be necessary for those pressure sensors that require a datum before measuring a relative pressure differential. In one embodiment, initializing the pressure sensor 232 can include exposing the first pressure port 334a and the second pressure port 334b to the same static pressure to establish a "zero" pressure differential between the two ports. This step can be accomplished in one embodiment by moving the valve 336 from the first position 337a as illustrated in FIG. 3 to the second position 337b so that the first pressure port 334a can sense the static air pressure in the room 240. Because the second pressure port 334b also senses the static air pressure in the room 240, the two pressure ports will be in equilibrium, corresponding to a zero pressure differential.

After the pressure sensor 232 has been initialized, the method 400a proceeds to block 404 and measures the difference between the static air pressure at a location inside the chassis 208 (e.g., in the cabinet plenum 344) and the static air pressure at a location outside the chassis 208 (e.g., in the room 240). In one embodiment, this step is accomplished by moving the valve 336 from the second position 337b back to the first position 337a so that the first pressure port 334a can sense the static air pressure in the cabinet plenum 344. Because the second pressure port 334b senses the static air pressure in the room 240, the pressure sensor 232 measures a difference in static air pressure (ΔP) between the cabinet plenum 344 and the room 240.

In decision block 406, the method 400a determines if the pressure differential (ΔP) is greater than or equal to a design pressure differential ($\Delta P_{DES}$). In one embodiment, the $\Delta P_{DES}$ can be a pressure differential that empirical or theoretical analysis has shown provides adequate cooling of the computer modules 206. For example, in one embodiment, a $\Delta P_{DES}$ of from about 0.5 inch $H_2O$ to about 2.5 inches $H_2O$ can provide adequate cooling. In another embodiment, a $\Delta P_{DES}$ of from about 1.0 inch $H_2O$ to about 2.0 inches $H_2O$, e.g., about 1.5 inches $H_2O$, can provide adequate cooling. In other embodiments, other $\Delta P_{DES}$ may provide better cooling characteristics depending on the particular configuration of the corresponding computer system and/or the particular cooling requirements of the computer modules. Returning to decision block 406, if ΔP is greater than or equal to $\Delta P_{DES}$, then the method 400a returns to block 404 and repeats. Conversely, if ΔP is less than $\Delta P_{DES}$, then the method 400a proceeds to block 408 and starts the air mover 230.

After starting the air mover 230, the method 400a proceeds to block 410 and again measures the difference between the static air pressure inside the chassis 208 and the static air pressure outside the chassis 208 (i.e., ΔP). In decision block 412, the method 400a determines if ΔP is still less than $\Delta P_{DES}$. If so, then the method 400a proceeds to block 414 and increases output from the air mover 230. The method 400a then returns to block 410 and repeats. Conversely, if ΔP is not less than $\Delta P_{DES}$, then the method 400a proceeds to decision block 416 to determine if ΔP is now greater than $\Delta P_{DES}$. If ΔP is greater than $\Delta P_{DES}$, then the method 400a proceeds to block 418 and decreases output from the air mover 230. The method 400a then returns to block 410 and repeats. Conversely, if ΔP is not greater than $\Delta P_{DES}$, then the method 400a returns to block 410 and repeats without adjusting the output from the air mover 230.

By using the method 400a, the output from the air mover 230 can be automatically adjusted to compensate for changes in the static pressure of the air flowing into the cabinet plenum 344 from the floor plenum 204. In this way, the computer modules 206 can receive sufficient cooling regardless of changes in the incoming air flow. Further, if the air mover 230 is turned off for a period of time while the computer modules 206 are not in use (for example, for service by facility personnel), the method 400a provides a means for restarting the air mover 230 and establishing the appropriate flow rate.

The method 400a described above represents one approach for automatically balancing the air flow between two or more computer cabinets in a large computer system in accordance with the present invention. In other embodiments, other methods can be used without departing from the spirit or scope of the present disclosure. For example, in another embodiment, a method starts when the air mover 230 is already running. In this embodiment, the method is similar to the method 400a of FIG. 4, except that blocks 404, 406, and 408 can be omitted and the method can begin at block 410.

Referring next to FIG. 4B, the method 400b is similar to portions of the method 400a described above. The method 400b, however, addresses the situation in which output from the air mover 230 cannot be increased because either the air mover 230 is already operating at maximum speed, or because the air mover 230 is operating in a low pressure zone. As discussed above, if the air mover 230 is operating in a low pressure zone, merely increasing the speed may not appreciably increase the flow of air through the corresponding computer cabinet 202.

In this embodiment, the method 400b starts with the air mover 230 "on" such that the air mover 230 is moving air through the corresponding computer cabinet 202. In block 420, the method 400b measures the difference between the static air pressure at a location inside the chassis 208 and the static air pressure at a location outside the chassis 208. In decision block 422, the method 400b determines if the pressure differential ΔP is less than $\Delta P_{DES}$. If ΔP is less than $\Delta P_{DES}$, then the method 400b proceeds to decision block 423 and determines if the air mover 230 is already providing maximum output. The air mover 230 may be providing maximum output if it is already operating at maximum speed. Alternatively, the air mover 230 may be providing maximum output if the inlet pressure from the floor plenum 204 is sufficiently low enough that increasing the speed of the air mover 230 will not appreciably increase the air flow through the corresponding computer cabinet 202. If the air mover 230 is not already operating at maximum output, then the method 400b proceeds to block 424 and increases output from the air mover 230. The method 400b then returns to block 420 and repeats.

Returning to decision block 423, if the air mover 230 is already operating at maximum output, then the method 400b proceeds to block 425 and increases output from the air conditioning source. In the embodiment illustrated in FIG. 2, the "air conditioning source" includes the air conditioning unit 210 that provides pressurized cooling air to the floor plenum 204 for distribution to the respective computer cabinets 202. After increasing output from the air conditioning source, the method 400b returns to block 420 and repeats.

Returning to decision block 422, if ΔP is not less than $\Delta P_{DES}$, then the routine 400b proceeds to decision block 426 and determines if ΔP is greater than $\Delta P_{DES}$. If ΔP is not greater than $\Delta P_{DES}$, then the method 400b returns to block 420 and repeats. Conversely, if ΔP is greater than $\Delta P_{DES}$, then the method 400b advances to block 428 and decreases output from the air mover 230. From block 428, the method 400b returns to block 420 and repeats.

Other useful methods can be implemented by the balancing system 260 of FIG. 2 in addition to the methods 400a and 400b described above. For example, one such method can be implemented to ensure that the air movers 230 always rotate in the appropriate direction, even if a particular air mover 230 has been incorrectly configured by the manufacturer or a field service personnel. This method is performed for individual computer cabinets 202 by spinning the air mover 230 in a first direction and measuring a first pressure difference between the static air pressure inside the chassis 208 and the static air pressure outside the chassis 208. The method then includes spinning the air mover 230 in the opposite direction and measuring a second pressure difference between the static air pressure inside the chassis 208 and the static air pressure outside the chassis 208. The direction of rotation that results in the highest air pressure inside the chassis 208 is the direction that is adopted for subsequent operation of the air mover 230.

FIGS. 5A-5C are partially schematic elevation views illustrating computer cabinets 502a-c having air flow balancing systems 560a-c, respectively, configured in accordance with other embodiments of the invention. Referring first to FIG. 5A, in one aspect of this embodiment, the computer cabinet 502a includes an air mover 530 positioned toward a top portion of the computer cabinet 502a proximate to an air outlet portion 509. Aside from the position of the air mover 530, other aspects of the computer cabinet 502a can be at least generally similar in structure and function to the computer cabinet 202 described above with reference to FIGS. 2-4.

Referring next to FIG. 5B, the computer cabinet 502b can be at least generally similar in structure and function to the computer cabinet 202 described above with reference to FIGS. 2-4. In this embodiment, however, the processor 238 is operably coupled to a vent controller 550. The vent controller 550 is operably coupled to a vent 552 that can open or close to adjust the flow of air through the computer cabinet 502b. In operation, the air mover 230 operates at a constant speed, and the pressure sensor 232 measures the difference in static pressure between the cabinet plenum 344 and the room 240 as described above. If the processor 238 determines that the flow through the computer cabinet 502b should be increased for adequate cooling of the computer modules 206, the processor 238 commands the vent controller 550 to open the vent 552 farther. Conversely, if the processor 238 determines that too much air is flowing through the computer cabinet 502b, the processor 238 commands the vent controller 550 to close the vent 552 farther.

Referring now to FIG. 5C, the computer cabinet 502c can be at least generally similar in structure and function to the computer cabinet 202 described above with reference to FIGS. 2-4. In this embodiment, however, the computer cabinet 502c includes a temperature sensor 533 but no pressure sensor. The temperature sensor 533 can be configured to measure a temperature inside the computer cabinet 502c, such as a temperature at least proximate to a "hot spot" on one of the computer modules 206. Such a hot spot may exist at a location in the computer cabinet 502c that only receives a marginal flow of cooling air. In operation, the temperature sensor 533 can communicate temperature information to a processor 538. If the processor 538 determines that the temperature at the particular location in the computer cabinet 502c is unacceptably high, the processor 538 sends an appropriate command to the controller 239 causing the controller 239 to increase output from the air mover 230. Conversely, if the processor 538 determines that the temperature inside the computer cabinet 502c is well below the upper limit, then the processor 538 can command the controller 239 to reduce output from the air mover 230, thereby conserving cooling air for other computer cabinets that may need it more than the computer cabinet 502c.

Figure 6:
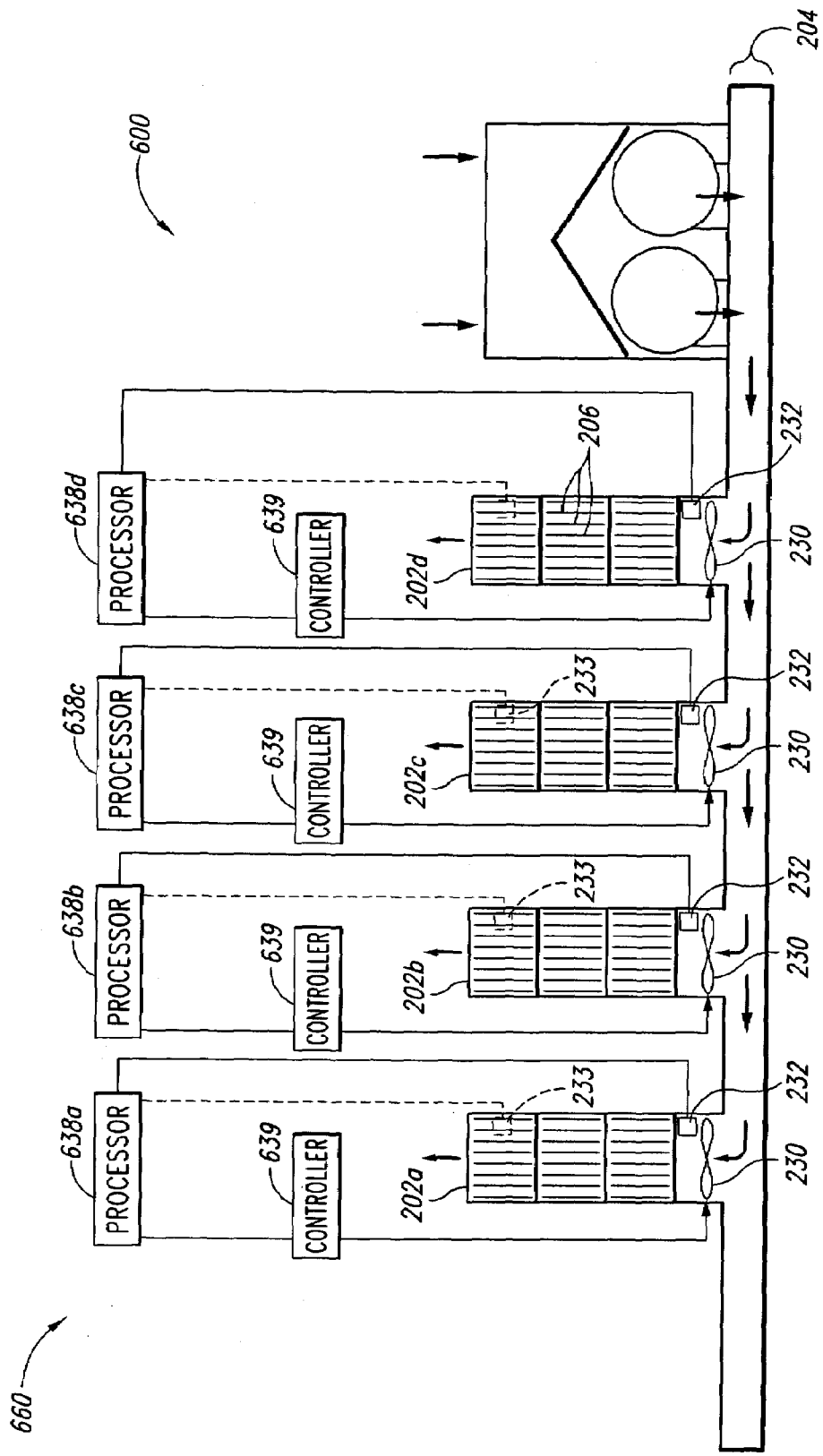
FIG. 6 is a partially schematic elevation view of a computer system having an air flow balancing system configured in accordance with another embodiment of the invention.

FIG. 6 is a partially schematic elevation view of a computer system 600 configured in accordance with another embodiment of the invention. Many parts of the computer system 600 can be at least generally similar in structure and function to their corresponding counterparts discussed above with reference to FIG. 2. In the illustrated embodiment, however, the computer system 600 includes an air flow balancing system 660 having a plurality of processors 638 (identified individually as processors 638a-d) individually associated with a corresponding computer cabinet 202. In this embodiment, each of the processors 638 only monitors the flow characteristics associated with the corresponding computer cabinet 202. Accordingly, if one the processors 638 determines that the air flow through the corresponding computer cabinet 202 should be increased, the processor 638 transmits an appropriate command to a corresponding controller 639, which in turn modulates the speed of the associated air mover 630 to comply with the command from the processor 638. This embodiment differs from the embodiment of FIG. 2 described above because each of the processors 638 of this embodiment operates autonomously to provide adequate cooling to the corresponding computer cabinet 202. The only communication between respective processors 638 is indirect and occurs by way of changes in the flow of inlet air coming from the floor plenum 204.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A computer system comprising:
a chassis;
a computer module positioned in the chassis;
an air mover configured to move air through the chassis along a flow path past the computer module;
a sensor configured to measure a parameter associated with the air moving through the chassis, wherein the air mover is operably coupled to the sensor and configured to respond to a change in the parameter; and
a pressure port positioned in the chassis and operably connected to the sensor, wherein the pressure port is positioned upstream of the computer module in the flow path.

2. The computer system of claim 1 wherein the parameter is a pressure differential between a first air pressure inside the chassis and a second air pressure outside the chassis.

3. The computer system of claim 1 wherein the parameter is a pressure differential between a first air pressure inside the chassis and a second air pressure outside the chassis, and wherein the air mover is configured to increase the flow of air through the chassis in response to a decrease in the difference between the first air pressure and the second air pressure.

4. The computer system of claim 1, further comprising a computer module compartment positioned in the chassis, wherein the computer module is one of a plurality of computer modules held in the computer module compartment, and wherein the air mover is configured to move air through the chassis and past the plurality of computer modules.

5. The computer system of claim 1 wherein the chassis includes an air inlet portion spaced apart from an air outlet portion, and wherein the air mover is positioned at least proximate to the air inlet portion.

6. The computer system of claim 1 wherein the chassis includes an air inlet portion spaced apart from an air outlet portion, and wherein the air inlet portion is configured to receive air from a plenum extending beneath a floor on which the chassis is positioned.

7. The computer system of claim 1, further comprising a plenum extending beneath a floor on which the chassis is positioned, wherein the chassis includes an air inlet portion spaced apart from an air outlet portion, and wherein the air inlet portion is configured to receive air from the plenum.

8. The computer system of claim 1 wherein the air mover includes a variable speed fan operably connected to the sensor.

9. The computer system of claim 1, wherein the chassis includes an air inlet portion spaced apart from an air outlet portion, wherein the air mover is positioned at least proximate to the air inlet portion, and wherein the pressure port is positioned between the air mover and the computer module.

10. The computer system of claim 1 wherein the sensor is carried by the chassis.

11. The computer system of claim 1 wherein the sensor and the air mover are carried by the chassis.

12. A computer system comprising:
a chassis;
a computer module positioned in the chassis;
an air mover configured to move air through the chassis and past the computer module; and
a sensor configured to measure a difference between a first air pressure inside the chassis and upstream of the computer module and a second air pressure outside the chassis, wherein the air mover is operably coupled to the sensor and configured to change the movement of air through the chassis based on the difference between the first air pressure and the second air pressure.

13. The computer system of claim 12 wherein the air mover is configured to increase the flow of air through the chassis in response to a decrease in the difference between the first air pressure and the second air pressure.

14. The computer system of claim 12 wherein the sensor includes a first pressure port configured to sense the first air pressure and a second pressure port configured to sense the second air pressure.

15. The computer system of claim 12 wherein the chassis includes an air inlet portion spaced apart from an air outlet portion, wherein the sensor includes a first pressure port configured to sense the first air pressure at least proximate to the air inlet portion, and wherein the sensor further includes a second pressure port configured to sense the second air pressure.

16. The computer system of claim 12 wherein the chassis includes an air inlet portion spaced apart from an air outlet portion, wherein the air mover is positioned at least proximate to the air inlet portion, wherein the sensor includes a first pressure port configured to sense the first air pressure between the air mover and the computer module, and wherein the sensor further includes a second pressure port configured to sense the second air pressure.

17. A computer system comprising:
a chassis having an air inlet portion spaced apart from an air outlet portion, wherein the air inlet portion is configured to receive cooling air from a plenum;
an air mover positioned at least proximate to the chassis and configured to move the cooling air along an air flow path through at least a portion of the chassis;
a computer module compartment positioned in the air flow path in the chassis;
a plurality of computer modules held in the computer module compartment at least partially in the air flow path; and
a sensor configured to measure a difference between a first air pressure in the air flow path inside the chassis and a second air pressure outside the chassis, wherein the first air pressure is measured upstream of the computer modules held in the computer module compartment, and wherein the air mover is operably coupled to the sensor and configured to respond to the difference between the first air pressure and the second air pressure.

18. The computer system of claim 17 wherein the air mover is positioned toward a bottom portion of the chassis and configured to drive air through the chassis and the computer module compartment.

19. The computer system of claim 17 wherein the air mover is positioned toward an upper portion of the chassis and configured to draw air upward through the chassis and the computer module compartment.

20. The computer system of claim 17 wherein the air mover is carried by the chassis.

21. The computer system of claim 17 wherein the air mover and the computer module compartment are arranged vertically with respect to the chassis.

22. The computer system of claim 17 wherein the computer module compartment is configured to hold the plurality of computer modules in edgewise orientation with respect to the air flow path.

23. The computer system of claim 17 wherein each of the plurality of computer modules is individually carried by the computer module compartment, and wherein each of the plurality of computer modules includes at least a first computer processor.

24. The computer system of claim 17 wherein the chassis is a first chassis carrying a first plurality of computer modules, and wherein the computer system further comprises a second chassis spaced apart from the first chassis and carrying a second plurality of computer modules, wherein the second chassis includes a second air inlet portion spaced apart from a second air outlet portion, and wherein the second air inlet portion is configured to receive cooling air from the plenum.

25. A computer system comprising:
a first chassis configured to hold a first computer module;
a second chassis spaced apart from the first chassis and configured to hold a second computer module;
an air conditioning unit spaced apart from the first and second chassis, wherein the air conditioning unit is configured to provide a first air flow to the first chassis to cool the first computer module, and a second air flow to the second chassis to cool the second computer module;
a sensor configured to measure a parameter inside the first chassis that is associated with the first air flow through the first chassis; and
a processor operably coupled to the sensor, wherein the processor is configured to cause the first air flow through the first chassis to be changed based on the parameter.

26. The computer system of claim 25 wherein the processor is further configured to cause the second air flow through the second chassis to be changed based on the parameter.

27. The computer system of claim 25 wherein the sensor is a first sensor and the parameter is a first parameter, wherein the computer system further comprises a second sensor configured to measure a second parameter associated with the second air flow through the second chassis, wherein the processor is operably coupled to the second sensor and configured to cause the second air flow through the second chassis to be changed based on the second parameter.

28. A computer system comprising:
a first chassis configured to hold a first computer module;
a second chassis configured to hold a second computer module;
an air conditioning unit configured to provide a first air flow to the first chassis to cool the first computer module, and a second air flow to the second chassis to cool the second computer module;
a first sensor carried by the first chassis and configured to measure a first parameter associated with the first air flow through the first chassis;

a second sensor carried by the second chassis and configured to measure a second parameter associated with the second air flow through the second chassis; and a processor operably coupled to the first sensor and the second sensor, wherein the processor is configured to cause the first air flow through the first chassis to be changed based on the first parameter, and wherein the processor is further configured to cause the second air flow through the second chassis to be changed based on the second parameter.

29. The computer system of claim 25, further comprising an air mover operatively associated with the first chassis, wherein the processor is operably coupled to the air mover and configured to cause the air mover to change the first air flow through the first chassis based on the parameter.

30. The computer system of claim 25 wherein the parameter is a pressure differential between a first air pressure inside the first chassis and a second air pressure outside the first chassis.

31. The computer system of claim 25 wherein the parameter is a temperature inside the first chassis.

32. The computer system of claim 25 wherein the first and second chassis are positioned on a floor, and wherein the computer system further comprises a plenum extending beneath the floor from the air conditioning unit to the first and second chassis.

33. A computer system comprising:
a first chassis configured to hold a first computer module;
a second chassis configured to hold a second computer module;
an air conditioning unit configured to provide a first air flow to the first chassis to cool the first computer module, and a second air flow to the second chassis to cool the second computer module;
a first sensor carried by the first chassis and configured to measure a first parameter associated with the first air flow through the first chassis;
a second sensor carried by the second chassis and configured to measure a second parameter associated with the second air flow through the second chassis; and
a processor operably coupled to the first and second sensors, the processor including computer-readable instructions causing the processor to adjust at least the first air flow through the first chassis based on the first and second parameters.

34. The computer system of claim 33 wherein the computer-readable instructions further cause the processor to adjust the second air flow through the second chassis based on the first and second parameters.

35. The computer system of claim 33, further comprising an air mover operatively associated with the first chassis and operably coupled to the processor, wherein the computer-readable instructions cause the processor to cause the air mover to change the first air flow through the first chassis based on the first and second parameters.

36. A computer-implemented method for cooling a computer module positioned in a chassis, the method comprising:
sensing a difference between a first air pressure inside the chassis and upstream of the computer module and a second air pressure outside the chassis; and
changing a flow of air past the computer module in the chassis based on the difference between the first and second air pressures.

37. The method of claim 36 wherein changing a flow of air includes controlling an air mover in flow communication with the chassis.

38. The method of claim 36 wherein changing a flow of air includes increasing the flow of air through the chassis when the difference between the first and second air pressures is less than or equal to a preselected pressure.

39. The method of claim 36, further comprising flowing cooling air from an external source through the chassis before sensing a difference between a first air pressure inside the chassis and a second air pressure outside the chassis, wherein changing a flow of air past the computer module includes adjusting the flow of cooling air through the chassis.

40. A computer-implemented method for cooling a plurality of computer modules positioned in a chassis, the method comprising:
flowing air from a plenum into the chassis past the plurality of computer modules;
sensing a difference between a first air pressure inside the chassis and upstream of the computer modules and a second air pressure outside the chassis; and
when the sensed difference between the first and second air pressures is less than or equal to a preselected value, increasing the flow of air from the plenum into the chassis.

41. The method of claim 40, further comprising maintaining or decreasing the flow of air from the plenum into the chassis when the sensed difference between the first and second air pressures is greater than the preselected value.

42. The method of claim 40 wherein increasing the flow of air from the plenum into the chassis includes operating an air mover at a higher rate.

43. The method of claim 40 wherein increasing the flow of air from the plenum into the chassis includes operating an air mover positioned in the chassis at a higher rate.

44. A method for balancing a distribution of air between two or more computer cabinets, the method comprising:
flowing air from a plenum into a first chassis, the first chassis holding a first computer module;
flowing air from the plenum into a second chassis, the second chassis holding a second computer module; and
when a first air pressure in the first chassis is less than a second air pressure in the second chassis, increasing the flow of air through the first chassis.

45. The method of claim 44, further comprising, when the second air pressure in the second chassis is less than the first air pressure in the first chassis, increasing the flow of air through the second chassis.

46. The method of claim 44 wherein increasing the flow of air through the first chassis includes increasing the output from an air mover carried by the first chassis.

47. The method of claim 44 wherein increasing the flow of air through the first chassis includes opening a vent in the first chassis.

48. A system for cooling a plurality of computer modules positioned in a chassis, the system comprising:
means for flowing air from a plenum into the chassis;
means for sensing a difference between a first air pressure inside the chassis and upstream of the computer modules and a second air pressure outside the chassis; and
means for changing the flow of air from the plenum into the chassis based on the difference between a first air pressure inside the chassis and upstream of the computer modules and a second air pressure outside the chassis.

49. The system of claim 48 wherein the means for changing the flow of air include means for increasing the flow of air when the difference between the first and second air pressures is less than or equal to a preselected value.

50. The system of claim 48 wherein the means for changing the flow of air include means for changing the output from an air mover carried by the chassis.

51. The system of claim 48, further comprising means for holding the plurality of computer modules in edgewise orientation relative to the air flowing into the chassis from the plenum.

52. The computer system of claim 28 wherein the first chassis is independent of, and spaced apart from, the second chassis.

53. The computer system of claim 28 wherein the first chassis is part of a first computer cabinet and the second chassis is part of a second computer cabinet spaced apart from the first computer cabinet.

54. The computer system of claim 33 wherein the first chassis is part of a first computer cabinet and the second chassis is part of a second computer cabinet spaced apart from the first computer cabinet.

55. The method of claim 44 wherein flowing air from a plenum into a first chassis includes flowing air from a plenum into a first chassis of a first computer cabinet, and wherein flowing air from the plenum into a second computer chassis includes flowing air from the plenum into a second chassis of a second computer cabinet spaced apart from the first computer cabinet.

56. A computer system comprising:
- a first chassis configured to hold a first computer module;
- a second chassis configured to hold a second computer module;
- an air conditioning unit configured to provide a first air flow to the first chassis to cool the first computer module, and a second air flow to the second chassis to cool the second computer module;
- a first sensor configured to measure a first air pressure inside the first chassis;
- a second sensor configured to measure a second air pressure inside the second chassis; and
- a processor operably coupled to the first and second sensors, wherein the processor is configured to adjust at least the first air flow through the first chassis based on the first and second air pressures.

57. The computer system of claim 56 wherein the processor is further configured to adjust the second air flow through the second chassis based on the first and second air pressures.

58. The computer system of claim 56, further comprising an air mover operatively associated with the first chassis and operably coupled to the processor, wherein the processor is configured to cause the air mover to change the first air flow through the first chassis based on the first and second air pressures.

59. The computer system of claim 56, further comprising an air mover operatively associated with the first chassis and operably coupled to the processor, wherein the processor is configured to cause the air mover to increase the first air flow through the first chassis when the first air pressure is less than the second air pressure.

60. The computer system of claim 56 wherein the first chassis is independent of, and spaced apart from, the second chassis.

61. The computer system of claim 56 wherein the first chassis is part of a first computer cabinet and the second chassis is part of a second computer cabinet spaced apart from the first computer cabinet.

* * * * *